US008193816B2

(12) United States Patent
Perryman et al.

(10) Patent No.: US 8,193,816 B2
(45) Date of Patent: Jun. 5, 2012

(54) DETECTION OF FAULTS IN AN INJECTOR ARRANGEMENT

(75) Inventors: Louisa J. Perryman, Rainham (GB); Martin A. P. Sykes, Rainham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 833 days.

(21) Appl. No.: 12/291,516

(22) Filed: Nov. 7, 2008

(65) Prior Publication Data

US 2009/0140747 A1 Jun. 4, 2009

(30) Foreign Application Priority Data

Nov. 9, 2007 (EP) .................................... 07254415

(51) Int. Cl.
*G01R 31/08* (2006.01)
*G01R 31/02* (2006.01)
*F02M 51/00* (2006.01)

(52) U.S. Cl. ......................... 324/522; 324/537; 123/479

(58) Field of Classification Search .................. 324/522, 324/537; 123/479
See application file for complete search history.

(56) References Cited

U.S. PATENT DOCUMENTS

| | | | |
|---|---|---|---|
| 7,117,852 B2 | 10/2006 | Santero et al. |
| 2002/0041475 A1 | 4/2002 | Rueger et al. |
| 2005/0029905 A1 | 2/2005 | Dal et al. |
| 2007/0227506 A1 | 10/2007 | Perryman et al. |

FOREIGN PATENT DOCUMENTS

| | | |
|---|---|---|
| DE | 196 32 837 | 2/1998 |
| EP | 1 139 442 | 10/2001 |
| EP | 1 519 024 | 3/2005 |
| EP | 1 843 027 | 10/2007 |
| EP | 1 860 306 | 11/2007 |
| JP | 2002-81341 | 3/2002 |
| JP | 2006-105125 | 4/2006 |
| JP | 2006-322324 | 11/2006 |
| JP | 2007-292067 | 11/2007 |
| WO | 2005/106227 | 11/2005 |
| WO | 2006/037670 | 4/2006 |

OTHER PUBLICATIONS

Japan Office Action dated Aug. 12, 2010.
European Search Report dated Apr. 11, 2008.
Japan Office Action dated Apr. 15, 2011.

*Primary Examiner* — Amy He
(74) *Attorney, Agent, or Firm* — Thomas N. Twomey

(57) ABSTRACT

A method and apparatus for detecting faults in an injector arrangement is described. The injector arrangement comprises a plurality of piezoelectric injectors that are located in parallel branches of an injector bank circuit of an injector drive circuit. Each branch of the injector bank circuit comprises a high side isolation switch. The high side isolation switches are each operable to enable an associated piezoelectric injector in the injector bank circuit when closed, and disable the associated piezoelectric injector in the injector bank circuit when open. The fault detection method comprises the steps of operating the high side isolation switches so as to enable one of the piezoelectric injectors and disable the other piezoelectric injector(s), and performing diagnostics to detect the presence or absence of faults on the enabled piezoelectric injector.

17 Claims, 6 Drawing Sheets

DETECTION OF FAULTS IN AN INJECTOR ARRANGEMENT

TECHNICAL FIELD

The present invention relates to a method and apparatus for detecting faults in a fuel injector arrangement, and particularly to a method and apparatus for detecting short circuit faults in piezoelectric fuel injectors.

BACKGROUND TO THE INVENTION

In a direct injection internal combustion engine, a fuel injector is provided to deliver a charge of fuel to a combustion chamber prior to ignition. Typically, the fuel injector is mounted in a cylinder head with respect to the combustion chamber such that its tip protrudes slightly into the chamber in order to deliver a charge of fuel into the chamber.

One type of fuel injector that is particularly suited for use in a direct injection engine is a so-called piezoelectric injector. A piezoelectric injector 12 and its associated control system 14 are shown schematically in FIG. 1.

The piezoelectric injector 12 includes a piezoelectric actuator 16 that is operable to control the position of an injector valve needle 17 relative to a valve needle seat 18. The piezoelectric actuator 16 includes a stack 19 of piezoelectric elements, having the electrical characteristics of a capacitor. The stack 19 may be charged or discharged by application of a differential voltage to positive and negative terminals of the actuator 16, which causes the stack of piezoelectric elements to expand or contract. The expansion and contraction of the piezoelectric elements is used to vary the axial position, or 'lift', of the valve needle 17 relative to the valve needle seat 18.

The piezoelectric injector 12 is controlled by an injector control unit 22 (ICU) that forms an integral part of an engine control unit 24 (ECU). The ICU 22 typically comprises a microprocessor 26 and memory 28. The ECU 24 also comprises an injector drive circuit 30, to which the piezoelectric injector 12 is connected by way of first and second power supply leads 31, 32. In a so-called 'discharge to inject' injector, in order to initiate an injection event, the injector drive circuit 30 causes the differential voltage applied to the injector 12 to transition from a high voltage (typically 200 V), at which no fuel delivery occurs, to a relatively low voltage (typically −55 V), which causes the valve needle 17 to lift away from the valve needle seat 18.

Like any circuit, faults may occur in a drive circuit. In safety critical systems, such as diesel engine fuel injection systems, a fault in the drive circuit may lead to a failure of the injection system that could consequentially result in a catastrophic failure of the engine. Diagnostic systems for detecting short circuit faults in piezoelectric actuators of piezoelectric injectors are disclosed in applicant's co-pending patent applications EP1843027, EP1860306, EP1927743, and EP07252534.8, EP07254036.2 the contents of each document being incorporated herein by reference.

Of particular relevance to this application is co-pending application EP 07252534.8, which describes a diagnostic method for detecting three main types of short circuit fault, these are:

i) a short circuit between the terminals of a piezoelectric actuator; otherwise referred to as a 'stack terminal' short circuit;

ii) a short circuit from the positive terminal of a piezoelectric actuator to a ground potential; the positive terminal is also referred to as the 'high' terminal, and this type of short circuit is generally referred to as a 'high side to ground' short circuit; and iii) a short circuit from the negative terminal of a piezoelectric actuator to a ground potential; the negative terminal is also referred to as the 'low' terminal, and this type of short circuit is generally referred to as a 'low side to ground' short circuit.

Referring also to FIG. 2, this shows the injector drive circuit 30 described in EP 07252534.8. The injector drive circuit 30 comprises an injector bank circuit 33, in which a pair of piezoelectric injectors 12*a*, 12*b* are connected. It should be appreciated that although the respective injectors 12*a*, 12*b* are shown as integral to the injector bank circuit 33 in FIG. 2, in practice the injector bank circuit 33 would be remote from the injectors 12*a*, 12*b* and connected thereto by way of power supply leads.

The drive circuit 30 includes three voltage rails: a high voltage rail VH (typically 255 V), a mid voltage rail VM (typically 55 V), and a ground voltage rail VGND (i.e. 0 V). The drive circuit 30 is generally configured as a half H-bridge with the mid voltage rail VM serving as a bi-directional middle current path 34. The injector bank circuit 33 is located in the middle current path 34 of the drive circuit 30 and comprises a pair of parallel branches 33*a*, 33*b*, in which the piezoelectric actuators 16*a*, 16*b* (hereinafter referred to simply as 'actuators') of the injectors 12*a*, 12*b* are respectively connected. The injector bank circuit 33 further comprises a pair of injector select switches SQ1, SQ2 connected in series with the respective injectors 12*a*, 12*b* in the respective branches 33*a*, 33*b* of the injector bank circuit 33. Each injector select switch SQ1, SQ2 has a respective diode D1, D2 connected across it. The injector bank circuit 33 is located between, and coupled in series with, an inductor L1 and a current sensing and control means 35.

A voltage source VS is connected between the mid voltage rail VM and the ground rail VGND of the drive circuit 30. The voltage source VS may be provided by the vehicle battery (not shown) in conjunction with a step-up transformer (not shown), or other suitable power supply, for increasing the voltage from the battery to the required voltage of the mid voltage rail VM.

A first energy storage capacitor C1 is connected between the high and mid voltage rails VH, VM, and a second energy storage capacitor C2 is connected between the mid and ground voltage rails VM, VGND. The first capacitor C1, when fully charged, has a potential difference of about 200 Volts across it, whilst the potential difference across the second capacitor C2 is maintained at about 55 Volts. A charge switch Q1 is located between the high and mid voltage rails VH, VM, and a discharge switch Q2 is located between the mid voltage and ground rails VM, VGND.

In essence, the drive circuit 30 comprises a charge circuit and a discharge circuit. The charge circuit comprises the high and mid voltage rails VH, VM, the first capacitor C1 and the charge switch Q1, whereas the discharge circuit comprises the mid and ground rails VM, VGND, the second capacitor C2 and the discharge switch Q2. The charge switch Q1 is operable to connect the injectors 12*a*, 12*b* to the first capacitor C1 causing a current to flow in the charge circuit, in the direction of the arrow 'I-CHARGE', to charge the actuators 16*a*, 16*b* to a known voltage. The diodes D1, D2 connected across the injector select switches SQ1, SQ2 allow the injectors 12*a*, 12*b* to charge in parallel when the charge switch Q1 is closed. To initiate an injection event from a selected injector 12*a* or 12*b*, a current is caused to flow in the discharge circuit, in the direction of the arrow 'I-DISCHARGE'. This is achieved by closing both the discharge switch Q2 and an injector select switch SQ1, SQ2 to connect the selected injector 12*a* or 12*b* to the second capacitor C2.

The drive circuit 30 further includes a resistive bias network 36 connected between the high voltage rail VH and ground rail VGND, and intersecting the middle circuit branch 34 at a bias point PB. The restive bias network 36 is used to determine the voltage VB at the bias point PB in order to detect short circuit faults on the injectors 12*a*, 12*b*.

The resistive bias network 36 includes first, second and third resistors R1, R2, R3 connected together in series. The first resistor R1 is connected between the high voltage rail VH and the bias point PB, and the second and third resistors R2 and R3 are connected in series between the bias point PB and the ground rail VGND. The first, second and third resistors R1, R2, R3 each have a known resistance of a high order of magnitude, typically of the order of hundreds of kiloohms. For convenience, R1, R2 and R3 are used herein to refer to both the resistors and to the resistances of the resistors R1, R2, R3.

To determine the voltage VB at the bias point PB, a voltage VS is sampled between the second and third resistors R2, R3 in the resistive bias network 36 using an analogue to digital (A2D) module of the microprocessor 26 (FIG. 1). The resistors R2 and R3 form a potential divider, and so the voltage VB at the bias point PB is calculated according to equation 1 below.

$$V_B = \frac{V_S(R_2 + R_3)}{R_3} \quad (1)$$

To detect high and low side to ground short circuit faults on the injectors 12*a*, 12*b*, a so-called 'unselected voltage reading' technique can be employed. The unselected voltage reading technique involves determining the voltage VB at the bias point PB with neither of the injectors 12*a*, 12*b* selected, i.e. with both injector select switches SQ1, SQ2 open. When both injector select switches SQ1, SQ2 are open, a voltage $V_{Bpred}$ at the bias point PB can be predicted from the high rail voltage VH, and the value of the resistors R1, R2, R3 in the resistive bias network 36, according to equation 2 below.

$$V_{Bpred} = \frac{V_H(R_2 + R_3)}{R_1 + R_2 + R_3} \quad (2)$$

In the event that either of the injectors 12*a* or 12*b* has a high side to ground short circuit, then this short circuit behaves as a resistor connected in parallel with the resistors R2 and R3 in the resistive bias network 36. If the voltage VB is measured at the bias point PB when there is a high side to ground short circuit, then the measured voltage will be lower than the predicted voltage $V_{Bpred}$ according to equation 2 above. However, if one of the injectors 12*a*, 12*b* has a low side to ground short circuit, then the measured voltage at the bias point PB will be higher than the predicted voltage $V_{Bpred}$ according to equation 2, and will depend upon the inherent resistance of the low side to ground short circuit. Hence, by measuring the voltage at the bias point PB and comparing it to the predicted voltage $V_{Bpred}$ according to equation 2 above, high and low side to ground short circuit faults on the injector bank 33 can be detected.

Stack terminal short circuits can also be detected using the resistive bias network 36. If an injector 12*a*, 12*b* has a stack terminal short circuit, then it will not hold its charge following a charge event on the bank 33. Instead, the injector 12*a*, 12*b* will discharge through the stack terminal short circuit at a rate governed by the inherent resistance of the stack terminal short circuit. Stack terminal short circuits of suitably high resistance may not be detrimental to the normal operation of the system, and so a maximum acceptable rate of discharge may be predetermined, corresponding to a minimum acceptable resistance of a stack terminal short circuit.

To detect a stack terminal short circuit, a so-called 'selected voltage reading' technique can be employed. The selected voltage reading technique involves determining the voltage VB at the bias point PB with an injector 12*a* or 12*b* selected, i.e. with an injector select switch SQ1 or SQ2 closed. When an injector select switch SQ1 or SQ2 is closed, the voltage VB measured at the bias point PB is related to the voltage on the selected injector 12*a* or 12*b*. The voltage on the selected injector 12*a* or 12*b* can be obtained by subtracting the voltage on the mid voltage rail VM (55 V in this example) from the voltage VB at the bias point PB.

In the selected voltage reading technique, the voltage measurement is performed after a predetermined period following a charge event on the bank 33. The voltage on an injector 12*a*, 12*b* at the end of a charge event is known. If the voltage VB at the bias point PB is less than a predetermined voltage level, then this is indicative of a stack terminal short circuit, having a resistance below a predetermined minimum acceptable value, on one or both of the injectors 12*a*, 12*b*. It should be appreciated that the expression 'voltage on an injector' is used for convenience and refers to the voltage on the piezoelectric stack of the injector actuator 16*a*, 16*b*.

A disadvantage of using the selected voltage reading as described above to determine stack terminal short circuits on the injectors 12*a*, 12*b*, is that this technique can entail a charge share between the injectors 12*a* and 12*b* in the event of a stack terminal fault. Charge sharing occurs when a non-faulty injector 12*a*, 12*b* is selected causing it to discharge into a faulty injector 12*a*, 12*b*.

For example, referring to FIG. 2, if the second injector 12*b* has a stack terminal short circuit, then selecting the first injector 12*a* by closing the first injector select switch SQ1 will result in a closed loop in the injector bank circuit 33. The closed loop includes the diode D2 connected across the second injector select switch SQ2, and the closed first injector select switch SQ1. An uncontrolled current will flow from the non-faulty first injector 12*a*, around the closed loop to charge the discharged faulty second injector 12*b*, in turn resulting in the non-faulty first injector 12*a* discharging. Charge sharing can also occur if one of the injectors 12*a*, 12*b* has a stack terminal short circuit, when an injector 12*a* or 12*b* is selected for discharge by closing the associated injector select switch SQ1 or SQ2. Whilst the selected voltage reading technique is able to determine stack terminal short circuit faults on the injector bank 33, charging sharing prevents this technique from being able to determine which of the individual injectors 12*a*, 12*b* is at fault.

An alternative diagnostic technique for detecting stack terminal faults is a so-called 'charge pulse' technique, as described in EP 06256140.2 and EP 07252534.8. The charge pulse technique comprises performing a first 'charge pulse' on the injectors 12*a* and 12*b* by closing the charge switch Q1 for a short period of time; opening the charge switch Q1 and allowing a predetermined period of time to elapse before closing the charge switch Q1 again for another short period of time to perform a second charge pulse on the injectors 12*a*, 12*b*. If either of the injectors 12*a*, 12*b* has a stack terminal short circuit, then it will discharge to an extent during the predetermined period prior to the second charge pulse being performed. Hence, when the second charge pulse is performed, a current will flow in the charge circuit to recharge the discharged faulty injector 12a or 12b.

If neither of the injectors 12a, 12b has a stack terminal short circuit, then both injectors 12a, 12b should substantially hold their charge during the predetermined period prior to the second charge pulse being performed, in which case substantially no current will flow in the charge circuit when the second charge pulse is performed. The current sensing and control means 35 is arranged to monitor current flow during the second charge pulse. The presence of a current during the second charge pulse above a predetermined threshold current level is indicative of a stack terminal short circuit on one or both of the injectors 12a, 12b on the bank 33. The predetermined threshold current level is based on a minimum acceptable resistance of stack terminal short circuit and the duration of the predetermined period prior to the second charge pulse being performed.

Whilst the charge pulse technique described above does not suffer from the charge share problems of the selected voltage reading technique (because both injector select switches SQ1, SQ2 remain open), in common with the other diagnostic techniques described above, the charge pulse technique is not able to determine which of the individual injectors 12a, 12b is at fault.

As mentioned above, in each of the diagnostic techniques described above, faults can be traced as far as the injector bank 33, but faulty injectors 12a, 12b cannot be identified. In such circumstances, the recovery action on detection of a fault is to shut down the entire injector bank 33. In the case of a four-cylinder engine, this would result in the engine running on only two cylinders, when the fault may only be associated with one of the injectors 12a, 12b on the bank 33. This can cause associated problems at engine service, because further tests must be performed to identify the injector 12a, 12b at fault.

SUMMARY OF INVENTION

It is against this background that the invention provides, in a first aspect, a method of detecting faults in an injector arrangement comprising a plurality of piezoelectric injectors, the piezoelectric injectors being located in parallel branches of an injector bank circuit of an injector drive circuit and each branch of the injector bank circuit comprising a respective high side isolation switch operable to enable an associated piezoelectric injector in the injector bank circuit when closed, and disable the associated piezoelectric injector in the injector bank circuit when open, wherein the method comprises the steps of: operating the high side isolation switches so as to enable one of the piezoelectric injectors and disable the other piezoelectric injector(s); and performing diagnostics to detect the presence or absence of faults on the enabled piezoelectric injector.

The injector drive circuit is operable to selectively connect the injector bank circuit to a first voltage source to charge the piezoelectric injectors and to a second voltage source to discharge the piezoelectric injectors, the first voltage source being of higher voltage than the second voltage source. Each high side isolation switch is connected between a piezoelectric injector and the first voltage source in the respective branches of the injector bank circuit.

The use of high side isolation switches provides improvements in the diagnostics of short circuits on an injector bank. This is because the injectors can be tested for faults individually, one by one, so that a single faulty injector can be identified. This provides advantages when the engine is serviced, because the faulty injector can immediately be replaced without further tests being required to identify which injector on the bank is at fault. As such, the method may provide recording the location or address of a faulty injector in a memory device. The memory device can be read at engine service so that a service engineer can readily locate and replace the faulty injector.

Once a faulty injector has been identified by the diagnostics, the associated high side isolation switch may be opened to disable the faulty injector from the injector bank so that the engine can continue to run on all the remaining non-faulty injectors on the bank. Accordingly the method may provide the additional step of operating the associated high side isolation switch so as to disable the enabled injector in the event that a fault is determined on the enabled injector. Disabling the faulty injector results in the faulty injector being electrically isolated from the injector bank so that the faulty injector does not interfere with the normal operation of the remaining non-faulty injectors on the bank. A significant advantage of the high side isolation switches is that they enable high side to ground faults to be electrically isolated, which is not otherwise possible using switches located on the low sides of the injectors, which are commonly found in prior art injector drive circuits.

The diagnostics may include testing the enabled injector for high and low side to ground short circuit faults. This may be achieved by determining a bias voltage at a bias point in the injector drive circuit, and determining the presence of a high or low side to ground short circuit on the enabled piezoelectric injector if the bias voltage is not within a predetermined tolerance of a predicted bias voltage. A high side to ground short circuit may be determined if the bias voltage is lower than the predicted bias voltage by more than a first predetermined tolerance value. A low side to ground short circuit may be determined if the bias voltage is more than the predicted bias voltage by more than a second predetermined tolerance value. The unselected voltage reading technique, as described above by way of background to the invention, may be performed on the enabled injector to determine high and low side to ground short circuits.

Alternatively or additionally, the diagnostics may include testing the enabled injector for stack terminal short circuit faults. To test the enabled injector for a stack terminal fault, the method may comprise measuring a voltage indicative of the voltage on the enabled injector, comparing the measured voltage to a predetermined threshold voltage level, and determining the presence of a stack terminal short circuit if the measured voltage is less than the predetermined threshold voltage level. The selected voltage reading technique, as described above by way of background to the invention, may be performed on the enabled injector to determine stack terminal short circuits. As an alternative to using the selected voltage reading technique, the charge pulse technique, also described above by way of background to the invention, may be performed on the enabled injector.

In one embodiment of the invention, the high side isolation switches are predominantly open, such that the operating step comprises closing a high side isolation switch so as to enable the associated piezoelectric injector. With the high side isolation switches being predominantly open, the piezoelectric injectors are always electrically isolated from each other. This eliminates the possibility of charge sharing occurring between faulty and non-faulty injectors. Furthermore, this technique allows a faulty injector to be identified immediately and disabled without any post-processing steps being required to identify the injector at fault once a fault on the injector bank is detected. Relatively high speed high side isolation switches are required in this embodiment.

However, in another embodiment of the invention, the high side isolation switches are predominantly closed, such that the operating step comprises opening at least one high side isolation switch in order to leave a single high side isolation switch closed, and hence the associated piezoelectric injector enabled. With the high side isolation switches being predominantly closed, there remains a risk of charge sharing occurring between faulty and non-faulty injectors because the injectors are not always electrically isolated from each other. However, this technique allows relatively slow speed high side isolation switches to be used, which may provide a cost benefit.

In the case where the high side isolation switches are predominantly closed, the method may comprise performing a set of initial diagnostics on the injectors with all of the injectors enabled, i.e. with all of the high side isolation switches closed. The initial diagnostics enable the presence or absence of a fault on the injector bank to be determined, but do not locate the injector at fault. In the event that a fault is detected on the injector bank, one of high side isolation switches remains closed whilst the other high side isolation switches are opened so that only a single injector remains enabled on the bank. The enabled injector is then tested for faults as described above.

If the enabled injector is found to be at fault, then the associated high side isolation switch is opened to disable the faulty injector from the injector bank circuit. However, if the enabled injector is not found to be at fault, then in the case where there are only two injectors on the injector bank, the fault determined by the initial diagnostics can be attributed to the other injector. Alternatively, if the injector bank comprises more than two injectors, the remaining injectors are tested individually one at a time by closing and opening the high side isolation switches in the appropriate combinations. In either case, once the injector at fault has been determined, the high side isolation switch associated with the faulty injector is opened to disable the faulty injector, whilst the high side isolation switches associated with the injectors found to be non-faulty are closed to enable the non-faulty injectors so that the engine can run on all of the non-faulty injectors. In the unlikely event that more than one injector is found to be faulty, each faulty injector is disabled.

The initial diagnostics may comprise testing the injector arrangement for stack terminal faults using the charge pulse technique described above by way of background to the invention. Initially the charge pulse technique may be performed on all of the injectors, i.e. with each high side isolation switch closed so that each injector is enabled. In the event that a stack terminal short circuit is detected, then the method may comprise performing the charge pulse technique on individually enabled injectors to locate the injector at fault. However, once a stack terminal fault has been detected generally on the injector bank, and the injectors electrically isolated from one another, the selected voltage reading technique may be used, as described above by way of background to the invention, to determine which of the injectors is at fault. The selected voltage reading technique is of higher resolution than the charge pulse technique and the risk of charge sharing is eliminated when the injectors are electrically isolated from one another.

Additionally or alternatively, the initial diagnostics may include testing the injector arrangement for high side and low side to ground short circuits using the unselected voltage reading technique, also described above by way of background to the invention. In the event that a high or low side to ground short circuit is detected, then the method may comprise performing the unselected voltage reading technique on individually enabled injectors to locate the injector at fault.

According to a second aspect of the present invention, there is provided an apparatus for detecting faults in an injector arrangement comprising a plurality of piezoelectric injectors, the piezoelectric injectors being located in parallel branches of an injector bank circuit of an injector drive circuit and each branch of the injector bank circuit comprising a high side isolation switch operable to enable an associated piezoelectric injector in the injector bank circuit when closed, and disable the associated piezoelectric injector in the injector bank circuit when open, the apparatus further comprising diagnostic means for determining faults on the enabled piezoelectric injectors.

The injector drive circuit may be operable to selectively connect the injector bank circuit to a first voltage source to charge the piezoelectric injectors and to a second voltage source to discharge the piezoelectric injectors, wherein the first voltage source is of higher voltage than the second voltage source. The injectors are preferably discharge to inject injectors.

The injector bank circuit preferably includes a plurality of injector select switches individually associated with the respective injectors and connected on the low sides of the injectors. The injector select switches may be operated to select the individual piezoelectric injectors to perform an injection event. In this configuration, the piezoelectric injectors are each connected between a pair of switches: an injector select switch on the low side, and a high side isolation switch on the high side.

It will be appreciated that optional features of the method aspect of the invention are equally applicable to the apparatus aspect and vice versa.

BRIEF DESCRIPTION OF THE DRAWINGS

Reference has already been made to FIGS. 1 and 2 by way of technical background to the present invention.

Figure 3:
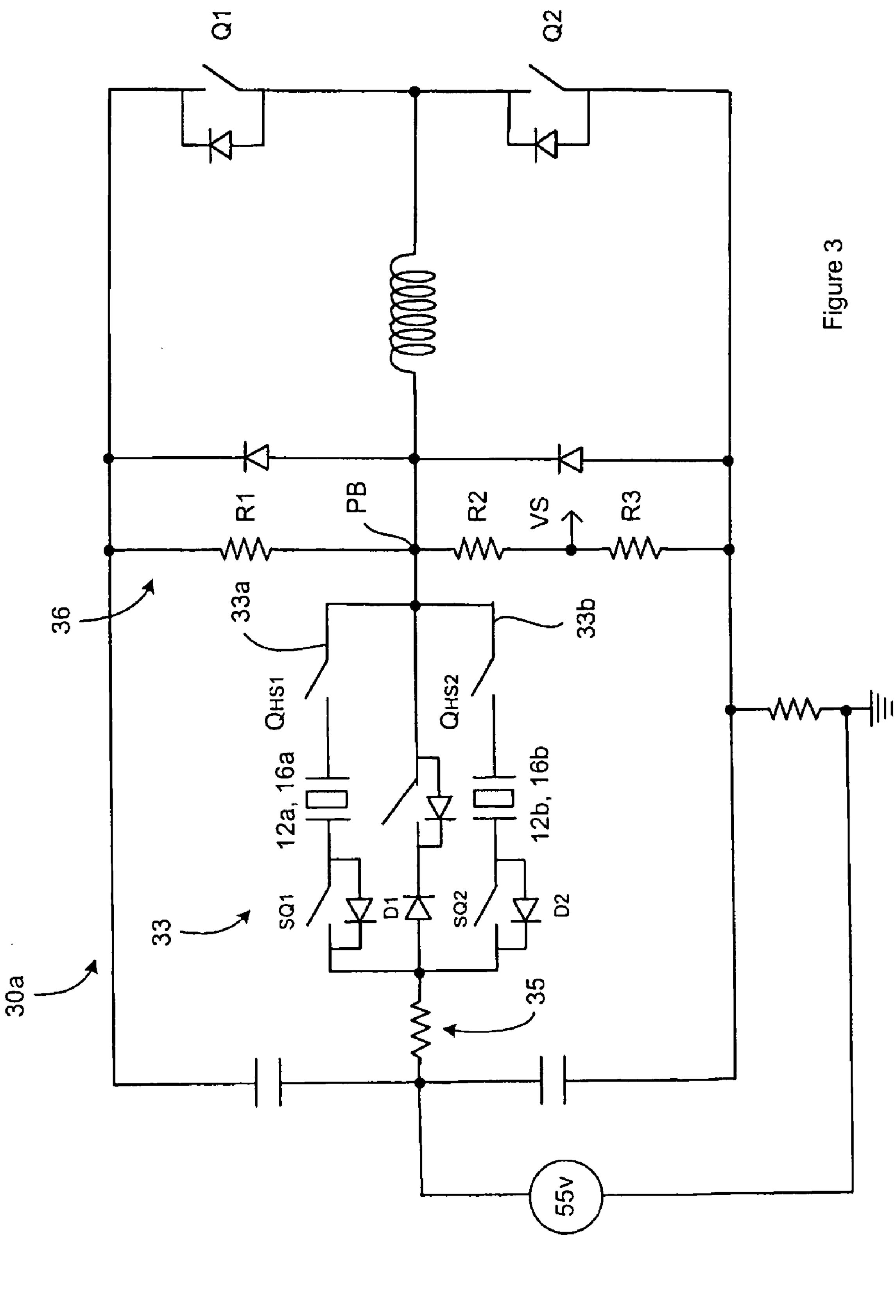
Figure 4:
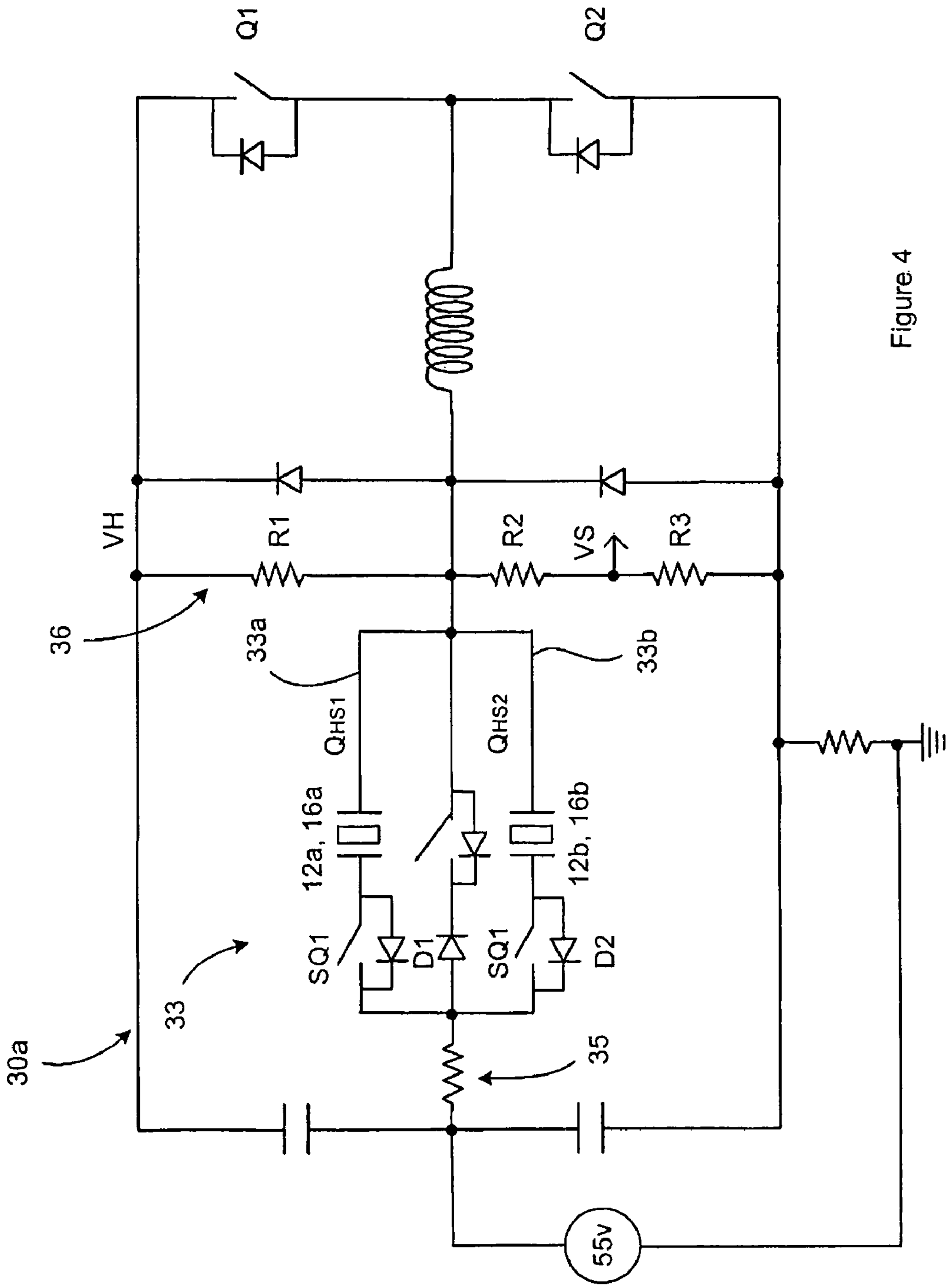
Figure 5:
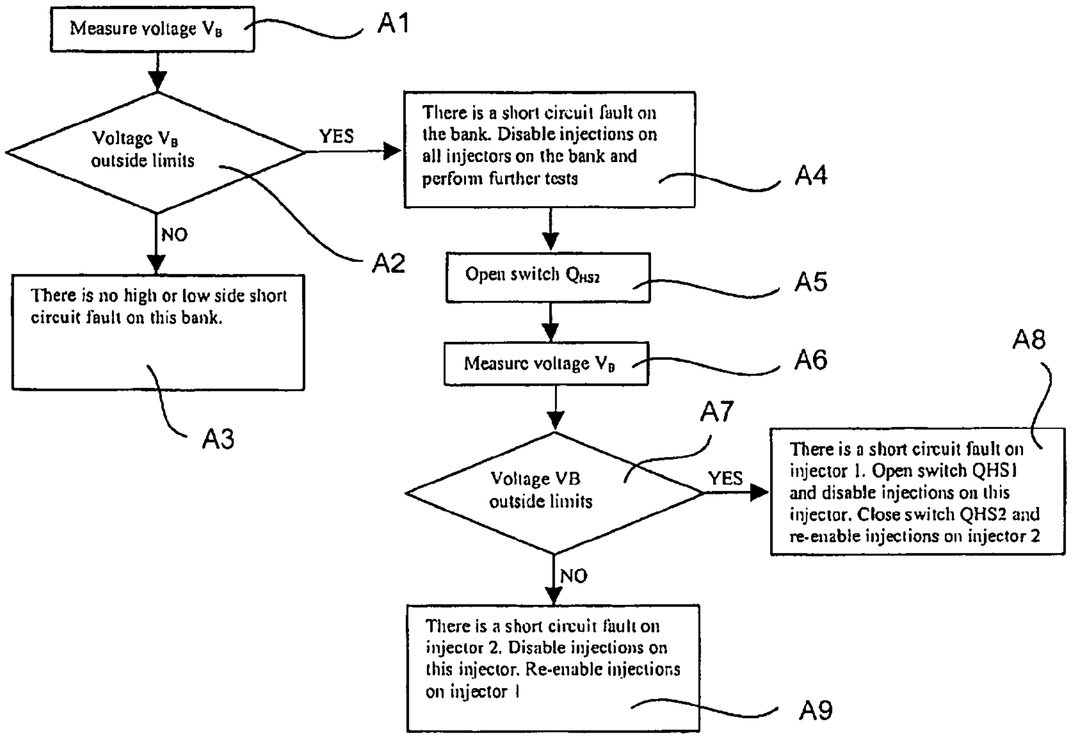
Figure 6:
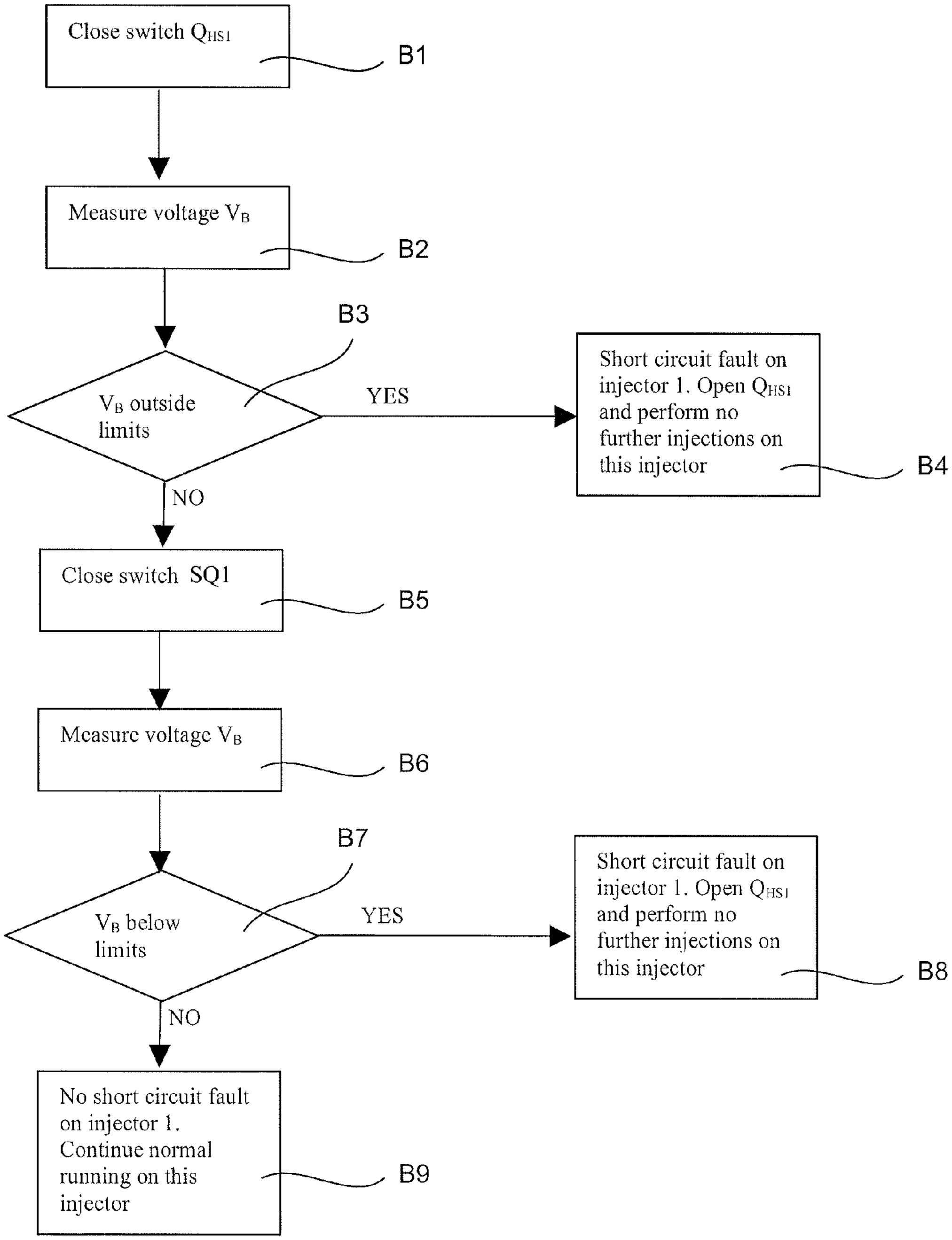

In order that it may be more readily understood, the present invention will now be described with reference to the following figures, in which:

FIG. 3 is a circuit diagram of an injector drive circuit for a pair of piezoelectric injectors, the injector drive circuit including a pair of high side isolation switches that are both open;

FIG. 4 is a circuit diagram of the injector drive circuit of FIG. 3, in which both of the high side isolation switches are closed;

FIG. 5 is a flow chart of a first diagnostic routine for detecting faults on the piezoelectric injectors connected in the injector drive circuit of FIGS. 3 and 4, with the default state of the high side isolation switches being closed as shown in FIG. 4; and FIG. 6 is a flow chart of a second diagnostic routine for detecting faults on the piezoelectric injectors connected in the injector drive circuit of FIGS. 3 and 4, with the default state of the high side isolation switches being open as shown in FIG. 3.

DETAILED DESCRIPTION OF THE PREFERRED EMBODIMENTS

Figure 2:
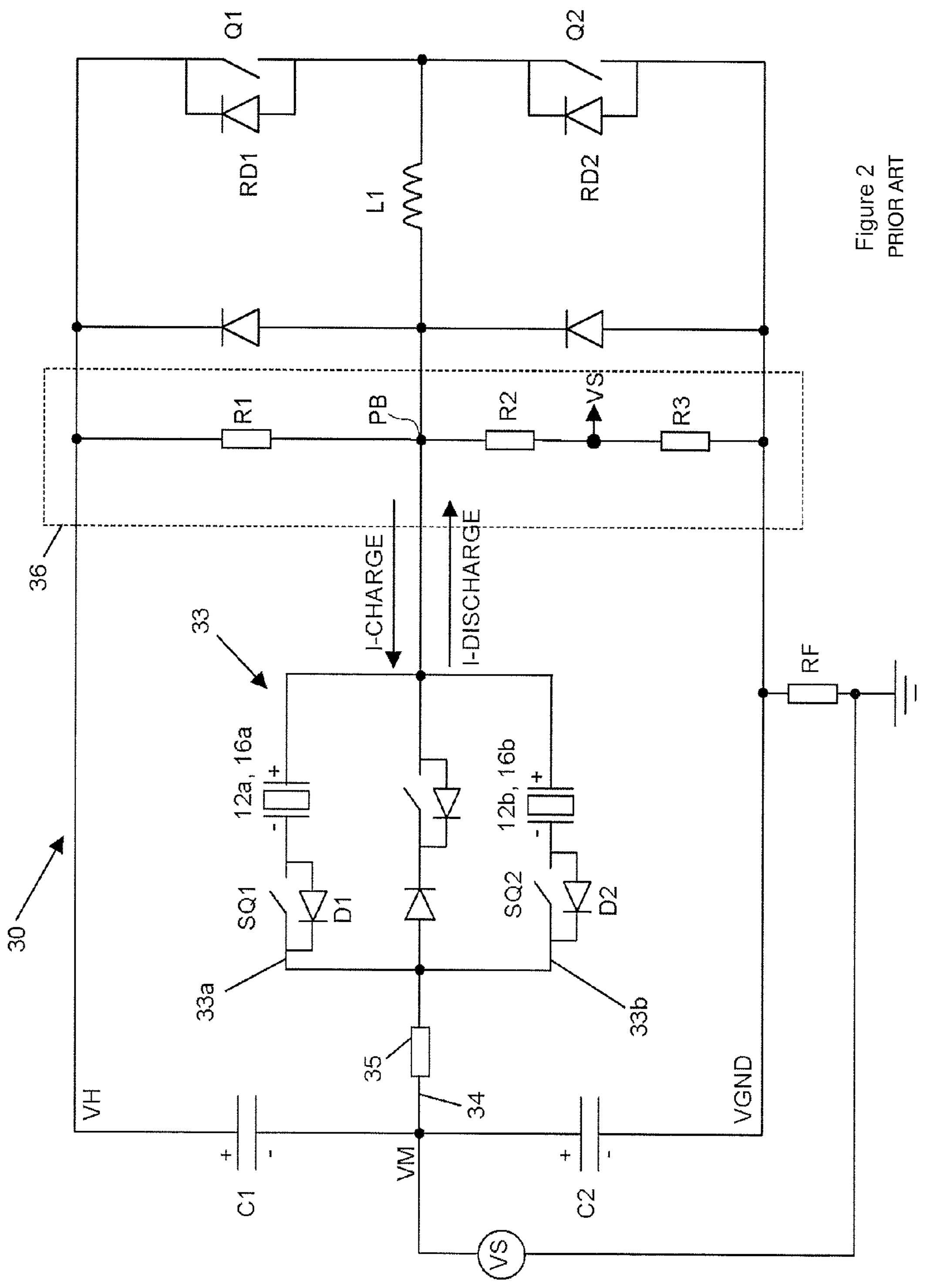
Figure 2 PRIOR ART
FIG. 2 is a circuit diagram of the injector drive circuit in FIG. 1.

Referring to FIG. 3, this shows an injector drive circuit 30 a similar to the drive circuit 30 in FIG. 2, but comprising a modified injector bank circuit 33. The modified injector bank circuit 33 is similar to the injector bank circuit 33 in FIG. 2, but also includes a pair of high side isolation switches QHS1, QHS2 connected in respective branches 33*a*, 33*b* of the injector bank circuit 33, on the high sides of the respective injectors 12*a*, 12*b*. Hence, each injector 12*a*, 12*b* is connected between an injector select switch SQ1, SQ2 on the low side, and a high side isolation switch QHS1, QHS2 on the high side.

There now follows a description of two different diagnostic routines for detecting short circuits on the injectors 12*a*, 12*b*, in which the high side isolation switches QHS1, QHS2 are utilized to determine which injector 12*a*, 12*b* is at fault and to disable the faulty injector 12*a*, 12*b*. As explained in further detail below, in the first diagnostic routine the default state of the high side isolation switches QHS1, QHS2 is closed as shown in FIG. 4, whilst in the second diagnostic routine the default state of the high side isolation switches QHS1, QHS2 is open as shown in FIG. 3.

Referring to FIG. 4, this shows the drive circuit 30*a* of FIG. 3 with both of the high side isolation switches QHS1, QHS2 closed. As described in further detail below, if a short circuit fault on the injector bank 33 is detected with the high side isolation switches QHS1, QHS2 closed, then the high side isolation switches QHS1, QHS2 are opened in turn and further tests conducted to determine which of the injectors 12*a*, 12*b* is at fault.

FIG. 5 is a flow diagram showing the steps of the first diagnostic routine, with the default state of the high side isolation switches QHS1, QHS2 being closed as shown in FIG. 4. Referring to FIG. 5 and also to FIG. 4:

[Step A1] With both high side isolation switches QHS1, QHS2 closed, and both injectors 12*a*, 12*b* deselected, i.e. with both of the injector select switches SQ1, SQ2 open, a voltage $VB_1$ at the bias point PB is determined by sampling the voltage VS between the second and third resistors R2, R3 in the resistive bias network 36 and calculating $VB_1$ according to equation 1 above.

[Step A2] The voltage $VB_1$ at the bias point PB is compared to a set of predetermined voltage limits. As described earlier, if either or both of the injectors 12*a*, 12*b* has a high side to ground short circuit, then the voltage $VB_1$ at the bias point PB will be lower than the predicted voltage $V_{Bpred}$ according to equation 2. Conversely, if either or both of the injectors 12*a*, 12*b* has a low side to ground short circuit, then the voltage $VB_1$ at the bias point PB will be higher than the predicted voltage $V_{Bpred}$ according to equation 2. This allows suitable voltage limits to be set, respectively, above and below the predicted voltage $V_{Bpred}$.

[Step A3] If the voltage $VB_1$ at the bias point PB is within the predetermined voltage limits, there are no high- or low-side to ground faults on the injector bank 33. Further tests are then performed as described later to determine if either or both of the injectors 12*a*, 12*b* has a stack terminal short circuit fault.

[Step A4] If the voltage VB, is not within the predetermined voltage limits, this is indicative of a high or low side to ground short circuit on the bank 33. When a high or low side to ground short circuit is detected on the injector bank 33, subsequent injections on both of the injectors 12*a*, 12*b* on the bank 33 are suspended and further tests are performed [Steps A5-A9] to determine which of the injectors 12*a*, 12*b* is at fault.

[Step A5] The second high side isolation switch QHS2 is opened to disconnect or electrically isolate, the second injector 12*b* from the injector bank 33.

[Step A6] A voltage $VB_2$ at the bias point PB is determined with the second injector 12*b* disconnected from the injector bank 33. At this point, the first high side isolation switch QHS1 is closed, the second high side isolation switch QHS2 is open, and both injector select switches SQ1, SQ2 are open.

[Step A7] The voltage $VB_2$ at the bias point PB determined at step A6 above is compared to the voltage limits described in Step A2.

[Step A8] If the voltage $VB_2$ at the bias point PB is outside the limits, then this indicates that the first injector 12*a* has a short circuit fault, and hence the fault detected at Step A4 is attributable, at least in part, to the first injector 12*a*. In this case, the first injector 12*a* is electrically isolated/disconnected from the injector bank 33 by opening the first high side isolation switch QHS1 to disable further charging and discharging of the first injector 12*a* and further injections from the first injector 12*a*. If the first injector 12*a* is found to be at fault, the second injector 12*b* is assumed to be non-faulty, and so the second high side isolation switch QHS2 is re-closed, to connect the second injector 12*b* back to the injector bank circuit 33, and injections on the second injector 12*b* are re-enabled. In the unlikely event that both injectors 12*a* and 12*b* are at fault, then the fault on the second injector 12*b* is detected by further diagnostics performed on the injector bank 33 with just the second injector 12*b* enabled i.e. with QHS2 closed and QHS1 open.

[Step A9] If the voltage $VB_2$ at the bias point PB is within the limits, then this indicates that the first injector 12*b* is non-faulty, and hence the short circuit fault detected at Step A4 above is on the second injector 12*b*. In this case, the second high side isolation switch QHS2 remains open and injections on the faulty second injector 12*b* are disabled, whilst injections on the non-faulty first injector 12*a* are re-enabled.

As mentioned at Step A3 above, if the voltage $VB_1$ at the bias point PB is within the predetermined voltage limits, then further tests are preformed to determine if either of the injectors 12*a*, 12*b* has a stack terminal short circuit fault. With the default state of the high side isolation switches QHS1, QHS2 being closed, the selected voltage reading technique, described above by way of background to the invention with reference to FIG. 2, is not utilized initially, because charge share between the injectors 12*a*, 12*b* can occur in the event of a stack terminal short circuit on one of the injectors 12*a*, 12*b*. Instead, the charge pulse technique, also described above by way of background to the invention with reference to FIG. 2, is used initially with both high side isolation switches QHS1, QHS2 closed. If a current is detected by the current sensing and control means, depicted in FIGS. 3 and 4 as a current sense resistor 35, when the second charge pulse is performed, and if this current exceeds a predetermined threshold level, this is indicative of a stack terminal short circuit on either or both of the injectors 12*a*, 12*b* on the injector bank 33.

To determine which of the injectors 12*a* or 12*b* is at fault, the selected voltage reading technique is used, as described above by way of background to the invention. To test the first injector 12*a* for a stack terminal short circuit using the selected voltage reading technique, the second high side isolation switch QHS2 is opened to disable the second injector 12*b*, leaving just the first injector 12*a* enabled. The first injector 12*a* is selected by closing the first injector select switch SQ1 and the voltage VB at the bias point PB is determined. If the voltage VB at the bias point PB is less than a predetermined voltage level, then this is indicative of a stack terminal short circuit on the selected first injector 12*a*. However, if the voltage VB is equal to or greater than the predetermined voltage level, then it can be inferred that the second injector 12*b* has a stack terminal fault.

Referring now to the second diagnostic routine. As mentioned above, in the second diagnostic routine the default state of the high side isolation switches QHS1, QHS2 is open, as shown in FIG. 3. The high side isolation switches QHS1, QHS2 are only closed when an injection or diagnostic event is to be performed on the bank 33. The high side isolation switches QHS1, QHS2 are closed in turn to enable a single injector 12*a* or 12*b*, and to allow diagnostics to be performed on the single enabled injector 12*a* or 12*b*.

FIG. 6 is a flow diagram showing the steps of the second diagnostic routine to determine if a fault exists on the first injector 12*a*. A similar test could be performed to determine if a fault exists on the second injector 12*b*. Initially both high side isolation switches QHS1, QHS2 are open as shown in FIG. 3. Referring now to FIG. 6 and also to FIG. 3:

[Step B1] The first high side isolation switch QHS1 is closed to enable the first injector 12*a* on the injector bank 33. The second high side isolation switch QHS2 remains open such that the second injector 12*b* is disabled from the bank 33. Both injector select switches SQ1, SQ2 are open.

[Step B2] The voltage VB at the bias point PB is determined.

[Step B3] The voltage VB at the bias point PB is compared to a set of predetermined voltage limits, in the same way as described above for Step A2 of the first diagnostic routine, in order to test the first injector 12*a* for high or low side to ground short circuit faults.

[Step B4] If the voltage VB at the bias point PB is not within the predetermined voltage limits, this is indicative of a high or low side to ground short circuit on the first injector 12*a*. If a high or low side to ground short circuit is detected on the first injector 12*a*, then the first high side isolation switch QHS1 is opened to disable the first injector 12*a* from the bank 33.

[Step B5] If the voltage VB at the bias point PB is within the predetermined voltage limits, then there are no high or low side to ground short circuits on the first injector 12*a*. The first injector 12*a* is then selected by closing the first injector select switch SQ1, and tested for stack terminal short circuits using the selected voltage reading technique [Steps B6 to B9], which is also described above by way of background to the invention with reference to FIG. 3.

[Step B6] With both the first high side isolation switch QHS1 and the first injector select switch OS1 closed, the voltage VB at the bias point PB is determined.

[Step B7] The voltage VB at the bias point PB is compared to a predetermined threshold level.

[Step B8] If the voltage VB at the bias point PB is less than the predetermined threshold level, this is indicative of a stack terminal short circuit on the first injector 12*a*. If a stack terminal short circuit is determined on the first injector 12*a*, then the first high side isolation switch QHS1 is opened to disable the faulty first injector 12*a* from the bank 33. No further injections are performed on the faulty first injector 12*a*.

[Step B9] If the voltage VB at the bias point PB is greater than the predetermined threshold level, then there is not a stack terminal short circuit fault on the first injector 12*a*. In this case, normal running is continued on the first injector 12*a*. The second injector 12*b* is tested by opening the first high side isolation switch QHS1, closing the second high side isolation switch QHS2, and performing steps B1 to B9 on the second injector 12*b*.

With the high side isolation switches QHS1, QHS2 being predominantly open as in the second diagnostic routine (FIGS. 3 and 6), the injectors 12*a*, 12*b* are always electrically isolated from one another. This allows a faulty injector 12*a*, 12*b* to be identified immediately and switched off with no risk of charge share occurring between the injectors 12*a*, 12*b*. This also allows the voltage on an injector 12*a*, 12*b* to be measured with no risk of charge share with the other injector 12*a*, 12*b*, thereby providing added flexibility to the diagnostics. The second diagnostic routine (FIG. 6) requires relatively high speed high side isolation switches QHS1, QHS2.

With the high side isolation switches QHS1, QHS2 being predominantly closed as in the first diagnostic routine (FIGS. 4 and 5), there remains a risk of charge sharing occurring and additional diagnostic steps must be performed to determine the injector 12*a*, 12*b* at fault once the presence of a fault is determined on the bank 33. These additional diagnostic steps, which are otherwise referred to as 'post-processing', require both injectors 12*a*, 12*b* to be shut down until the faulty injector 12*a*, 12*b* is identified. However, this technique allows slower speed high side isolation switches QHS1, QHS2 to be used, which may provide cost benefits.

In both the first and second diagnostic routines, described above with reference to FIGS. 5 and 6 respectively, the use of high side isolation switches QHS1, QHS2 enables a faulty injector 12*a*, 12*b* to be diagnosed and disabled from the injector bank 33. Disabling the faulty injector 12*a*, 12*b* electrically isolates the faulty injector 12*a*, 12*b* from the other injectors 12*a*, 12*b* on the bank 33. Once disabled, any short circuit faults associated with the faulty injector 12*a*, 12*b* will then not affect the normal operation of the remaining non-faulty injectors 12*a*, 12*b* on the bank 33.

In addition to the advantages described above, the inclusion of isolation switches QHS1, QHS2 on the high sides of the injectors 12*a*, 12*b* enables high side to ground faults on the injectors 12*a*, 12*b* to be electrically isolated. This has not been possible until now, because switches have traditionally been located on the low side of the injectors 12*a*, 12*b*, which means that even when these switches are opened, a high side to ground short circuit is not electrically isolated and may disrupt the normal operation of non-faulty injectors 12*a*, 12*b* on the bank 33.

The terms 'open' and 'close' used to described the operation of the various switches are used herein for convenience. These terms are not intended to limit the invention, and as such, the term 'close' is intended to mean operating a switch to allow current to pass, whereas the term 'open' is intended to mean operating a switch to substantially prevent current from passing.

Figure 1:
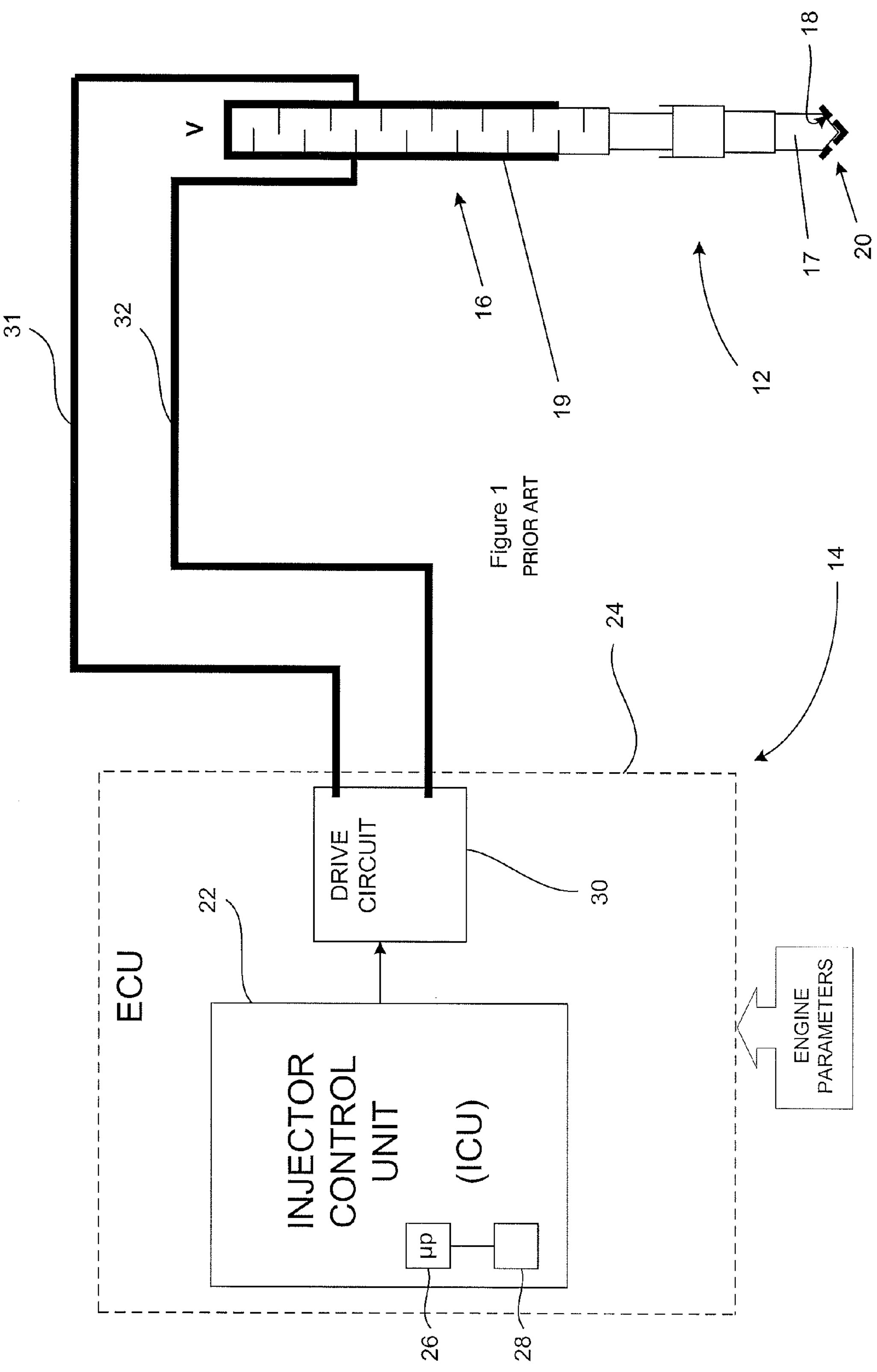
Figure 1 PRIOR ART
FIG. 1 is a schematic representation of a known piezoelectric injector and its associated control system comprising injector drive circuit.

It will be appreciated that the methods described above are automated under the control of the microprocessor 26 of the ECU 24 (FIG. 1). It will also be appreciated that whilst two injectors 12*a*, 12*b* are shown in the injector bank circuits 33 in FIGS. 3 and 4, in other embodiments of the invention, the injector bank 33 may include more than two injectors connected in parallel. Furthermore, whilst only one injector bank 33 is described herein, the ECU 24 may be arranged to control more than one injector bank 33, in which case, each injector bank 33 will have its own drive circuit similar to the drive circuit 30*a* in FIGS. 3 and 4.

The invention claimed is:

1. A method of detecting faults in an injector arrangement comprising a plurality of piezoelectric injectors, the piezoelectric injectors being located in parallel branches of an injector bank circuit of an injector drive circuit and each branch of the injector bank circuit comprising a respective high side isolation switch operable to enable an associated piezoelectric injector in the injector bank circuit when closed, and to disable the associated piezoelectric injector in the injector bank circuit when open, wherein the method comprises the steps of:

operating the high side isolation switches so as to enable one of the piezoelectric injectors and disable the other piezoelectric injector(s); and performing diagnostics to detect the presence or absence of faults on the enabled piezoelectric injector.

2. The method of claim 1, further comprising operating the associated high side isolation switch so as to disable the enabled injector in the event that a fault is determined on the enabled injector.

3. The method of claim 1, further comprising: determining a bias voltage at a bias point in the injector drive circuit, and determining the presence of a high or low side to ground short circuit fault on the enabled piezoelectric injector if the bias voltage is not within a predetermined tolerance of a predicted bias voltage.

4. The method of claim 3, further comprising determining the presence of a high side to ground short circuit fault in the event that the bias voltage is lower than the predicted bias voltage by more than a first predetermined tolerance value.

5. The method of claim 3, further comprising determining the presence of a low side to ground short circuit fault in the event that the bias voltage exceeds the predicted bias voltage by more than a second predetermined tolerance value.

6. The method of claim 1, further comprising measuring a voltage indicative of the voltage on the enabled injector, comparing the measured voltage to a predetermined threshold voltage level, and determining the presence of a stack terminal short circuit fault if the measured voltage is less than the predetermined threshold voltage level.

7. The method of claim 1, wherein the operating step comprises closing a high side isolation switch so as to enable the associated piezoelectric injector.

8. The method of claim 1, wherein the operating step comprises opening at least one high side isolation switch in order to leave a single piezoelectric injector enabled.

9. The method of claim 8, further comprising performing a set of initial diagnostics on the injector arrangement with all of the piezoelectric injectors enabled, in order to determine the presence of a fault in the injector arrangement, prior to performing the step of operating the high side isolation switches so as to enable one of the piezoelectric injectors and disable the other piezoelectric injector(s).

10. The method of claim 1, further comprising recording the location or address of a faulty piezoelectric injector in a memory device.

11. A computer program on a computer readable memory or storage device for execution by a computer, the computer program comprising a computer program software portion that, when executed, is operable to implement the method of claim 1.

12. A data storage medium having the computer software portion of claim 11 stored thereon.

13. A microcomputer provided with the data storage medium of claim 12.

14. An apparatus for detecting faults in an injector arrangement comprising a plurality of piezoelectric injectors, the piezoelectric injectors being located in parallel branches of an injector bank circuit of an injector drive circuit and each branch of the injector bank circuit comprising a respective high side isolation switch operable to enable an associated piezoelectric injector in the injector bank circuit when closed, and disable the associated piezoelectric injector in the injector bank circuit when open, the apparatus further comprising a diagnostic arrangement for determining faults on the enabled piezoelectric injectors.

15. The apparatus of claim 14, wherein the injector drive circuit is operable to selectively connect the injector bank circuit to a first voltage source to charge the piezoelectric injectors and to a second voltage source to discharge the piezoelectric injectors, wherein the first voltage source is of higher voltage than the second voltage source.

16. The apparatus of claim 14, wherein the piezoelectric injectors are discharged to inject injectors.

17. An apparatus of claim 15, wherein the injector bank circuit further comprises a plurality of injector select switches, each injector select switch being associated with a respective piezoelectric injector and connected in a respective branch of the injector bank circuit between the piezoelectric injectors and the second voltage source.

* * * * *